United States Patent [19]

Carsten

[11] Patent Number: 5,539,354
[45] Date of Patent: Jul. 23, 1996

[54] INTEGRATOR FOR INDUCTIVE CURRENT SENSOR

[76] Inventor: Bruce W. Carsten, 6, 5707 Sidley St., Burnaby, B.C., Canada, V5J 5E6

[21] Appl. No.: 108,408

[22] Filed: Aug. 18, 1993

[51] Int. Cl.[6] .............................. H03B 1/00; H04B 1/10
[52] U.S. Cl. ........................ 327/559; 327/552; 327/345
[58] Field of Search .................................. 307/520, 521, 307/494; 328/127, 167; 330/303, 306; 327/551–559, 336, 345

[56] References Cited

U.S. PATENT DOCUMENTS

| | | | |
|---|---|---|---|
| 3,667,055 | 5/1972 | Uchida | 328/127 |
| 3,946,328 | 3/1976 | Boctor | 307/521 |
| 3,986,127 | 10/1976 | Ray | 328/127 |
| 4,470,020 | 9/1984 | Mohr | 330/306 |
| 4,551,636 | 11/1985 | Andrews et al. | 327/530 |
| 4,591,810 | 5/1986 | Mackenzie . | |
| 4,761,605 | 8/1988 | Jochum . | |
| 4,980,794 | 12/1990 | Engel . | |
| 4,984,292 | 1/1991 | Millen | 307/520 |

OTHER PUBLICATIONS

Johnson et al., "A Handbook of Active Filters," Prentice-Hall, Inc., 1980, pp. 93–95.

Primary Examiner—Toan Tran
Attorney, Agent, or Firm—Townsend and Townsend and Crew

[57] ABSTRACT

A circuit for an inductive current sensor that optimizes waveform fidelity of the inductively sensed current for non-sinusoidal currents is claimed. The circuit employs a high gain op amp to sum the inputs of a feedback capacitor and other feedback impedance components including a second op amp and a capacitor, the values of which are selected to provide a double pole roll-off with a gain peaking Q of between 1 and 10, and an impedance which at the low corner frequency is approximately equal to that of the feedback capacitor. Above the low corner frequency of the sensor, the impedance is sufficiently high to have substantially no effect on the circuit and which decreases below the low corner frequency.

5 Claims, 4 Drawing Sheets 5,539,354

INTEGRATOR FOR INDUCTIVE CURRENT SENSOR

FIELD OF THE INVENTION

This invention relates to inductive current sensors which utilize current sensing or "pickup" coils wound on low permeability magnetic cores or air cores and which integrate the pickup coil voltage in order to reconstruct the original current waveform. More particularly the invention relates to modifications to the ideal integrator response, so as to optimize the waveform fidelity with non-sinusoidal currents while minimizing the low frequency noise and DC offset voltages produced by practical electronic integrators.

BACKGROUND OF THE INVENTION

It is well known that galvanically isolated AC current sensing can be achieved with a voltage sense winding on a low permeability magnetic core around a conductor carrying the current to be sensed. In practice, the magnetic core need not completely encompass the current carrying conductor, but need only be of suitable shape and in the proximity of the conductor such that magnetic flux is induced in the core by the current to be sensed.

If the magnetic core permeability does not vary appreciably with magnetic flux density or frequency, the voltage induced in the sense winding is proportional to the time derivative of the sensed current. It is further known that the original current waveform can be reconstructed by integrating the voltage on the sense winding. If the relative magnitude of the flux induced in the core by the sensed conductor current is known, the integrator voltage can be scaled to accurately represent the quantitative current magnitude. If the relative flux magnitude is not known, a qualitative representation of the current waveform is still obtained.

Although the low permeability magnetic core referred to above is often one of several distributed-gap magnetic materials collectively referred to as "powdered iron", the sense winding may in fact be wound on a non-magnetic material with a relative permeability of unity. Alternatively, the sense winding may be wound on a high permeability core with one or more discrete "air gaps" in the magnetic material to create a well defined effective permeability.

The following drawings will be referred to in further describing the background of the invention and the preferred and alternative embodiments thereof, wherein.

There are practical limits to integrating the sense winding voltage of prior art integrators to arbitrarily low frequencies. A Bode plot of the integrator gain will be used in discussing these limitations.

Finite Gain Limitations

Figure 1:
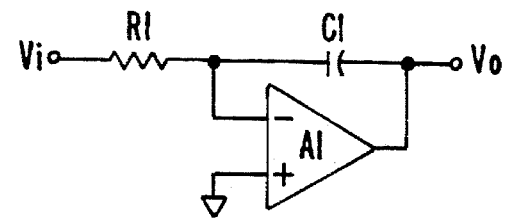
FIG. 1 illustrates a typical electronic integrator of the prior art.

A typical electronic integrator, shown in FIG. 1, comprises an operational amplifier "A1" with input voltage "Vi", input resistor "R1", feedback capacitor "C1" and output voltage "Vo". The theoretical transfer function is:

$$Vo = \frac{1}{(R1)(C1)} \int (Vi) dt$$

For AC voltages of frequency "f":

$$Vo = \frac{Vi}{2\pi f(R1)(C1)}$$

or:

$$\frac{Vo}{Vi} = \frac{1}{2\pi f(R1)(C1)}$$

Figure 2:
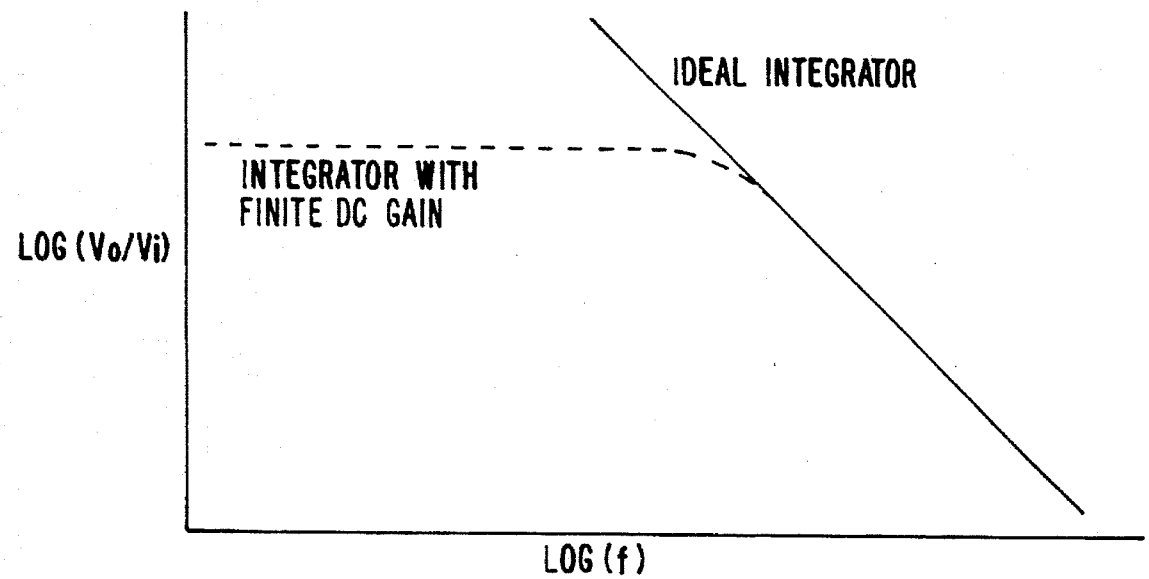
FIG. 2 is a Bode plot representative of the frequency response of the electronic integrator of FIG. 1.

The AC voltage gain of an ideal electronic integrator varies inversely with frequency, and thus has a slope of "−1" on a Bode plot of Log(Vo/Vi) vs. Log(f), as shown by the solid line in FIG. 2. All electronic integrators have a finite open loop gain, however, which causes integration to cease at some low frequency, as shown by the dotted line of slope "0" in FIG. 2. Any such deviation from ideal integrator behaviour at low frequencies will hereafter be referred to as the low frequency "roll-off" of the integrator, and points of Bode plot slope change as "corners" or "corner frequencies".

In some cases the low frequency gain may be intentionally limited to less than the (often poorly defined) open loop gain of the integrating amplifier, causing integrator roll-off to occur at a higher (but well defined) frequency than otherwise.

Integrator DC Offset Limitations

All integrators exhibit a finite input DC offset, which may range from microvolts to tens of milivolts. Amplifier gain is usually sufficiently high that the input offset would saturate the integrating amplifier output near one of the supply voltages, rendering it useless. Amplifier offset effects are typically minimized by the combination of techniques shown in FIG. 3. Input offset is largely nulled with potentiometer R5, DC gain is limited by R2 to prevent output saturation with residual input offset, and a DC blocking capacitor C2 is used on the output with DC restoration provided by R6.

Figure 4:
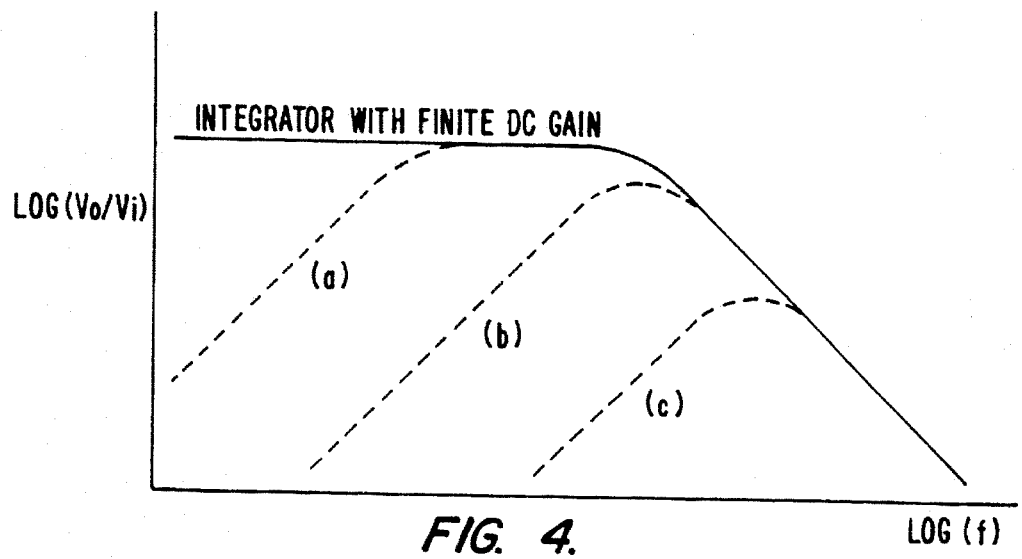
FIG. 4 is a Bode plot representative of the effect of the circuit of FIG. 3.

The C2–R6 pole causes the integrator output to roll off at a slope of +1 below, at or above the original integrator corner frequency as shown by curves "a", "b" and "c" respectively in FIG. 4. Normally the response of curve "a" or "b" would be chosen to provide the lowest corner frequency for a given DC amplifier gain.

Integrator Noise Limitations

All electronic integrators exhibit a finite amount of effective input noise, which at any frequency is amplified at the output by the gain of the integrator. This input noise may be constant with frequency ("white" noise), or begin to rise at frequencies below 1 Hz to 1 KHz (often called "pink" noise). In either case, amplification of input noise will be minimized when the integrator's Bode plot changes from a slope of −1 to +1 at the highest possible frequency, consistent with sufficiently accurate and faithful reproduction of the lowest frequency of interest. Thus curves "b" or "c" of FIG. 4 would be preferred for this requirement.

The integrator input "Vi" is the time derivative of the sensed current, so the variations from the ideal integrator response discussed above cause the current sensor-integrator as a whole to behave as a high pass current sensor. In practice most intended "high pass" circuits also have an upper frequency response limit, and are thus band pass circuits in actuality.

In most high pass and band pass circuits a flat response over the frequency range of interest is considered desirable. "Gain peaking" is therefore avoided at the double pole corner of curve "b" or "c" in FIG. 4, and this is accomplished by the circuit of FIG. 3 with a Q of 0.5. Typically a resonant Q of 0.50 (over damped) to 0.71 (critically damped) is utilized for flat response in high, low and band pass circuits. Gain peaking in prior art low, high, and band pass circuits is usually avoided. In the more common low pass circuits, significant gain peaking in the high frequency rolloff causes distortion with complex waveforms, and is avoided.

In most band pass systems the high and low frequency rolloffs are usually made symmetrical with no significant gain peaking. Even high pass circuits typically do not utilize significant gain peaking at the corner frequency. This is so because band pass and high pass circuits are usually used when there are low frequencies to be rejected, and gain peaking would cause problems when these frequencies coincided with the low corner frequency.

Any high frequency rolloff used to limit the upper frequency response of the current sensor would avoid gain peaking for the usual reasons, but in this application the situation is not symmetrical, and gain peaking is beneficial at the lower corner frequency.

In other systems where a high pass characteristic is unavoidable but not desirable, either a flat frequency response is more important than time domain fidelity, or it is acceptable to place the low frequency rolloff well below the lowest frequency of interest, since low frequency noise is not being enhanced by an integrator.

Although the integrator circuit roll-offs described above avoid the practical problems noted and achieve a maximally flat amplitude response in the frequency domain, they do not result in faithful time domain reconstructions of complex current waveforms near the integrator low frequency roll-off corner. The reason for this is a relative phase shift between the fundamental and harmonic frequencies that occurs well above the low frequency corner, causing time domain distortion in complex waveforms.

These distortions are observed when a harmonic rich "square wave" is used as a test waveform, where distortion is observed and measured as deviations from a flat top on the output waveform. A high pass (or band pass) circuit with a low Q on the lower corner frequency causes the top of a square wave to droop well above the corner frequency, where the amplitude response is essentially flat.

Figure 5:
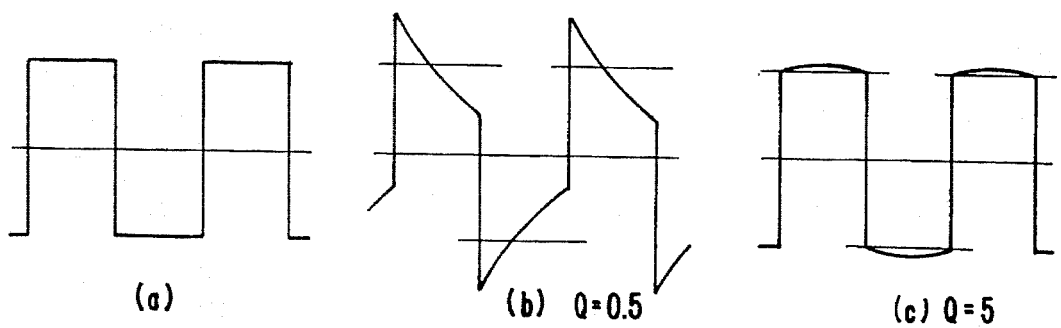
FIG. 5 illustrates square wave distortion effects resulting from different Q factors in the circuit of FIG. 3.

For example, the square wave response at five times the corner frequency for a double pole rolloff with Q=0.5 is shown in FIG. 5b, where the droop is about 60% of the step amplitude. The reason for this is illustrated in the "b" gain and phase curves of FIG. 6. Although the gain curve is still close to that of the ideal integrator, the phase has deviated significantly at the fundamental frequency. This phase shift of the fundamental relative to the harmonics causes the droop in the square wave, while the slight concavity is due to a small reduction in the amplitude of the fundamental.

If a square wave droop of less than 1% is desired, the low frequency corner would have to be 1/320th of the square wave frequency. Since the integrator gain continues to increase for 2½ decades below the fundamental frequency, the low frequency noise would be excessive and limit sensitivity to low currents. (A single pole integrator rolloff induces only half the distortion and could be at twice the frequency, but the second pole is needed to minimize DC offsets.)

Minimum waveform distortion is important in diagnostic applications (such as electronic switching power supplies for example), where the exact current waveform can reveal much about circuit operation. Minimizing relative phase shifts is also important in wattmeter applications, where the current is multiplied by voltage to obtain power flow, and phase shift errors degrade wattmeter accuracy.

SUMMARY OF THE INVENTION

The present invention relates to a deviation from prior art approaches described above in order to achieve maximum waveform fidelity when an integrator is used with inductive pickup coils to sense complex (non-sinusoidal) current waveforms; i.e., currents composed of two or more harmonically related frequencies.

The invention relies on the use of a double pole integrator roll-off with a gain peaking "Q" in the range of one to ten or moderately higher. This allows the roll-off frequency to be close to the lowest frequency to be measured, minimizing DC offset and noise in the output for a given time domain fidelity of reconstructed complex current waveforms.

Figure 6:
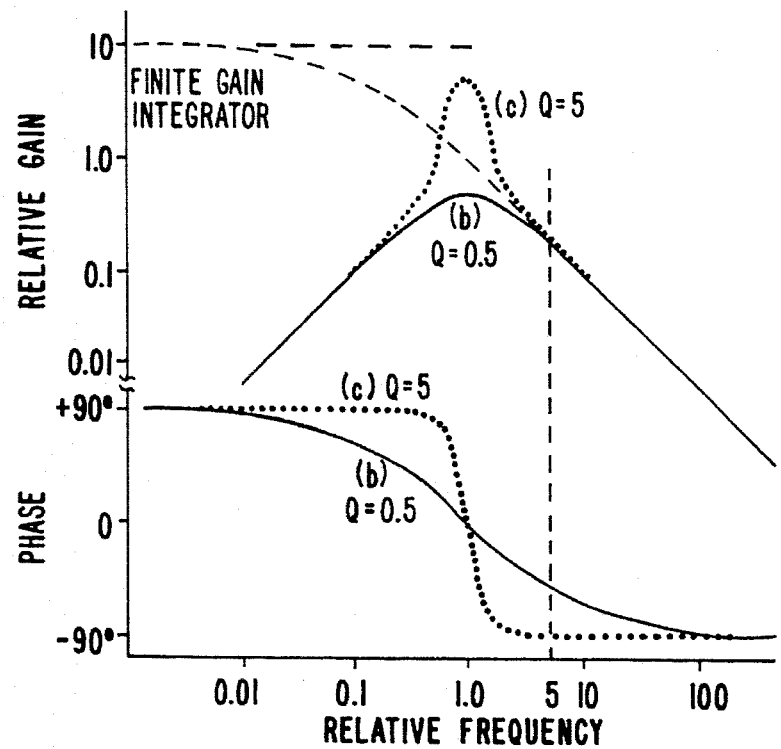
FIG. 6 is a plot of relative gain and phase versus relative frequency corresponding to the Q factors of FIG. 5.

If the double pole rolloff is designed with moderate gain peaking (Q>1) the phase shift above the corner frequency is greatly reduced, as shown for a Q of 5 in the gain and phase curves "c" of FIG. 6. The phase shift at five times the rolloff frequency is much less while the amplitude response has increased only slightly. The square wave response now exhibits a 3% bulge in the top, as shown in FIG. 5c. With a Q of 5 the distortion also decreases much faster with pole and signal frequency separation, such that a 1% square wave distortion now occurs at eight times the rolloff frequency. The low frequency poles can now be 40 times higher in frequency, reducing low frequency noise considerably.

There is little benefit to using a Q above 5 or 10 however, as the distortion due to gain peaking offsets the reductions due to lower phase shift. A higher Q also increases settling time to steady state response after input transients.

Accordingly in its broad aspect, the invention consists of an inductive current sensor for converting the induced voltage across the winding of the current sensor to a voltage representing the waveform of the sensed current. The current sensor includes means for integrating said current comprising a high gain op amp, a feedback capacitor associated with said op amp, means for producing feedback impedance associated with said op amp, other than said feedback capacitor and means for summing the outputs of the impedance feedback means and of said feedback capacitor at the input of said op amp.

Detailed description of the Preferred Embodiments

Figure 10:
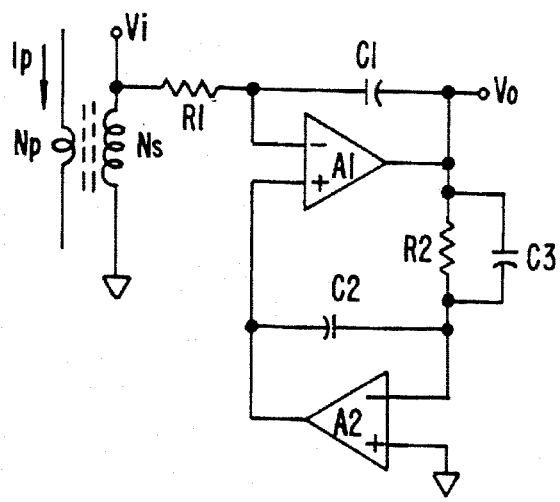
FIG. 10 illustrates the preferred embodiment of the invention using two op amps.
Figure 11:
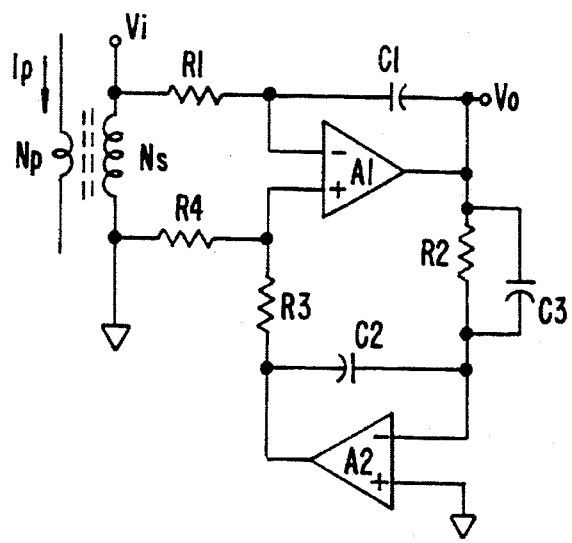
FIG. 11 illustrates an alternative embodiment of the invention using two op amps.
Figure 12:
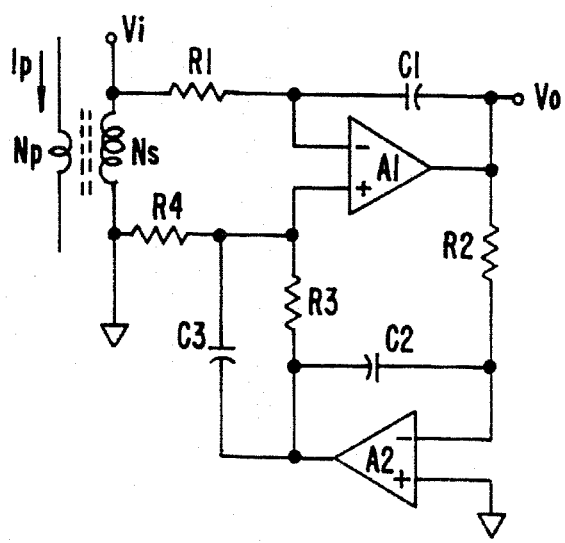
FIG. 12 illustrates a further alternative embodiment of the invention using two op amps.

Various embodiments of the invention are represented by FIGS. 8 to 13, in which FIG. 12 illustrates the preferred embodiment.

Figure 3:
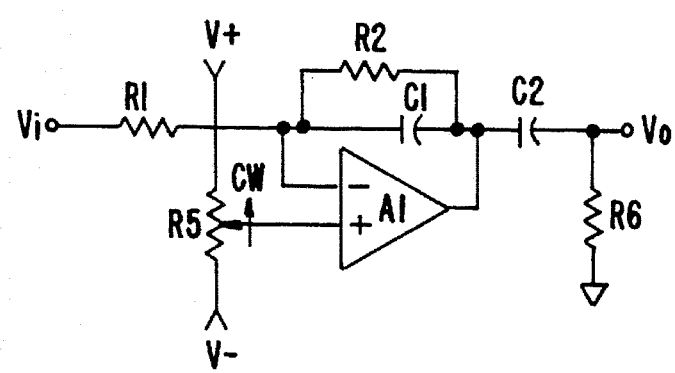
FIG. 3 illustrates prior art means of modifying the electronic integrator of FIG. 1 to compensate for amplifier offset effects.
Figure 7:
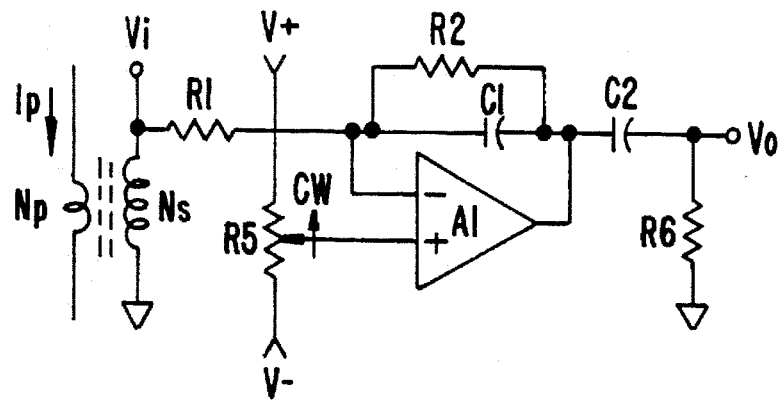
FIG. 7 illustrates the prior art integrator of FIG. 3 used to integrate the current induced on a winding.

FIG. 7 illustrates the prior art integrator of FIG. 3 utilized to integrate the output of an inductive current sensor L1, which has the current to be sensed "Ip" flowing in the primary winding "Np", and the inductor sense voltage generated by secondary pickup winding "Ns".

Figure 8:
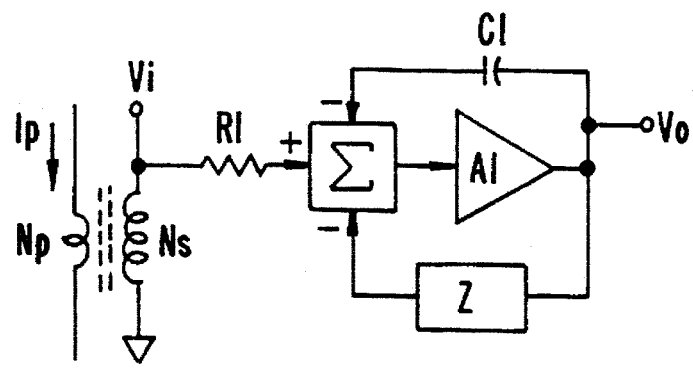
FIG. 8 is a diagram of the general embodiment of the invention.

FIG. 8 illustrates the general embodiment of the invention. The input signal from the pickup coil L1 is converted to a current by resistor R1, which is fed into a summing junction whose output is in turn fed into a high gain operational amplifier A1. The output voltage Vo of A1 is fed back into the summing node through a feedback capacitor C1. Since the sum of the currents into the junction must be zero, output voltage Vo is the integral of the input voltage. The invention comprises the inclusion of a third impedance network "Z" contributing impedance apart from the feedback capacitor C1. This third impedance network "Z" also feeds back from the amplifier output to the summing junction at the input of A1. As a result, the outputs of the impedance network and of the feedback capacitor are summed at the input of the op amp.

The impedance network Z may contain only passive elements or both active and passive elements. The impedance of Z vs. frequency is designed to be sufficiently high well above the low corner frequency that it has essentially no effect on the circuit, and at frequencies below the corner frequency the impedance becomes progressively lower than the impedance of C1 at the corner frequency to minimize output DC offsets. Near the corner frequency the impedance of Z is made essentially equal to that of C1, and the phase angle of the impedance Z is controlled to produce a gain peaking Q of one to ten in the input to output voltage ratio Vo/Vi.

Figure 9:
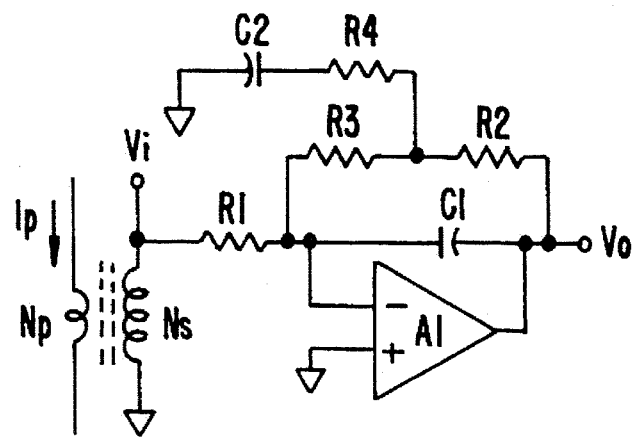
FIG. 9 illustrates the preferred embodiment of the invention using a single op amp.

FIG. 9 illustrates embodiment of the integrator utilizing a single operational amplifier. The second feedback network Z consists of R2, R3, R4 and C2, which is added in parallel with the original feedback capacitor C1 in FIG. 1. R2 and R3 are in series with one another and they are in parallel with C1. R4 and C2 are in series with one another and extend from between R2 and R3 to ground or common. The values of R2, R3 and C2 are selected to have a feedback impedance equivalent to C1 at the desired low (double pole) corner frequency, while R4 is selected to control the resonant "Q". Practical limitations of this circuit are the relatively large values of C2 required at lower corner frequencies, and the output DC offset which is always greater than the input DC offset voltage of A1.

The limitations of the circuit of FIG. 9 are overcome by the two-amplifier circuits of FIGS. 10, 11, 12 and 13. In these circuits the output DC offset of A1 is sensed and integrated by a second circuit comprised of A2, R2 and C2. The output of the second op amp A2 is inverted, so it is fed back into the positive (non-inverting) input of A1, reducing the output DC offset of A1 to the DC input offset voltage of A2. R2 and C2 are selected to provide an attenuated input to A1 equal to the feedback from C1 at the desired low corner frequency.

In the circuit of FIG. 10, C3 is added in parallel with R2 to shift the phase of amplifier A2's response at the corner frequency, limiting the corner frequency response Q to the desired value.

Figure 13:
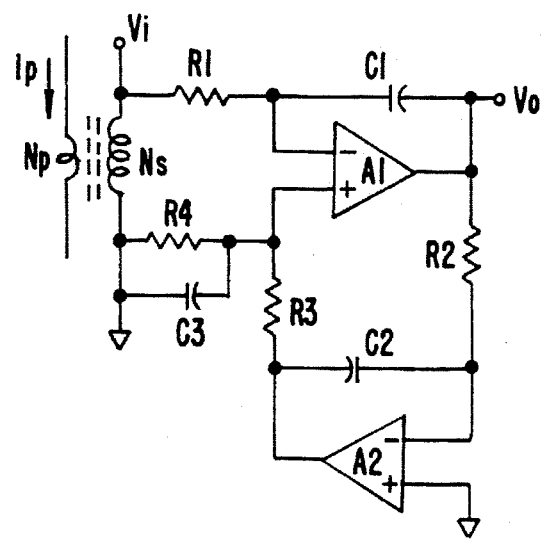
FIG. 13 illustrates yet another alternative embodiment of the invention using two op amps.

In FIGS. 11, 12 and 13, resistors R3 and R4 are added to the circuit of FIG. 10 to attenuate the output of A2 (up to a ratio of 100:1 to 1000:1 or more) to allow proportionally smaller values of C2 to be used (which are more practical and economical at low corner frequencies). The allowable attenuation is limited to the ratio of the output voltage capability of A2 to the input offset voltage of A1.

In FIGS. 11, 12 and 13 a resistor R4 is placed between the input of the high gain op amp A1 and the ground or common terminal of winding Ns, and R3 is placed between the output of the second op amp A2 and an input of A1.

In FIG. 12 and 13, C3 is placed in parallel with R3 and R4 instead of R2 respectively, in each case to shift the phase response of A2 near the corner frequency and limit the corner frequency Q to the desired value.

It will be appreciated by those skilled in the art that modifications to the preferred and alternative embodiments described herein, including the substitution of electrical equivalents, may be made without departing from the principles of the invention.

What I claim is:

1. For use in an inductive broadband current sensor having a sense winding for inductively sensing a complex current, circuit for converting a sense voltage across the sense winding to a voltage representing the waveform of the inductively sensed current, the circuit comprising:

a high gain op amp having a negative input and a positive input, resistance means connected between the sense winding and the negative input of the high gain op amp;

a feedback capacitor connected between an output of the op amp and said negative input; and a means other than said feedback capacitor for producing feedback impedance connected between the output of the op amp and one of the op amp inputs and including a second op amp in a feedback arrangement with said high gain op amp;

whereby the feedback from the feedback capacitor and the feedback from the feedback impedance are effectively summed at the inputs of the op amp, and wherein the means for producing feedback contributes a feedback impedance which:

at frequencies above the low corner frequency of the sensor is sufficiently high that it has substantially no effect on the circuit;

at frequencies near the low corner frequency is approximately equal to the impedance of the feedback capacitor; and at frequencies below the low corner frequency the feedback impedance becomes progressively lower than the impedance of the feedback capacitor at the corner frequency;

and wherein the phase angle of the feedback impedance produces a gain peaking Q of between 1 and 10 in the input to output voltage ratio of the sensor.

2. A circuit according to claim 1 further comprising a resistor and a second capacitor in parallel with one another and in series with the output of the high gain op amp and one of the inputs of the second op amp.

3. A circuit according to claim 2 further comprising first attenuation resistance means between one of the inputs of the high gain op amp and a ground terminal of the winding, and second resistance means connected between an output of the second op amp and said input of the high gain op amp.

4. A circuit according to claim 1 further comprising a resistor and a second capacitor in parallel with one another and in series with an output of the second op amp and one of the inputs of the high gain op amp, resistance means between the output of the second op amp and a ground terminal of the winding and resistance means between the output of the high gain op amp and one of the inputs of the second op amp.

5. A circuit according to claim 1 further comprising a resistor and a second capacitor in parallel with one another and extending between one of the inputs of the high gain op amp and a ground terminal of the winding, a resistance means in series with an output of the second op amp and one of the inputs of the high gain op amp and resistance means between the output of the high gain op amp and one of the inputs of the second op amp.

* * * * *